3,489,624
ETCHING TECHNIQUES FOR GLASS

Royston E. Lake, Dundas, and Colin West, Burlington, Ontario, Canada, assignors to Canadian Westinghouse Company Limited, Hamilton, Ontario, Canada, a company of Canada No Drawing. Filed Feb. 28, 1966, Ser. No. 530,738
Claims priority, application Canada, Mar. 31, 1965. 926,966
Int. Cl. B44c *1/22;* C03c *17/06, 15/00*
U.S. Cl. 156—15 7 Claims

ABSTRACT OF THE DISCLOSURE

This invention relates to the use of tin oxide as an etch-resist material when applied to glass substrates.

In the past few years the electronic industry has been developing new thin film products. A process has developed whereby semiconductive materials are deposited on a substrate to form part of an integrated circuit. Such depositions are generally achieved by a vacuum deposition or vapour diffusion through a suitable mask which has apertures in preselected areas to allow the semiconductor material to pass through the mask on to the uncovered areas of the substrate.

The problem of making masks has caused a good deal of concern and annoyance up to this point but it is believed that the method of this invention will provide a mask which is inexpensive and rigid and requires no mechanical machining, and on which any changes in device design pattern may be easily effected.

It is proposed that masks may be composed of very thin sheets of glass through which a desired pattern shall be etched, this being a marked change from previous masks which have generally been made of metal foil which has been etched with the desired pattern.

The finished metal foil pattern sheets require a cumbersome stretcher to assure that the mask remains flat because the metal foil tends to curl and become distorted due to the extreme thinness and lack of rigidity of the sheet.

The opposite approach to the problem is to use a thicker sheet of metal which by reason of its thickness is more rigid and machine the desired pattern into the sheet. This is time consuming and tedious when the pattern is complicated and intricate.

It is found by using a special etchant resist as well as an improved etching method that thin glass sheets may be etched to a high degree of definition to replace the above mentioned metal masks.

It is, therefore, an object of this invention to provide a glass mask which is rigid and is quickly and easily made and may have complicated and intricate patterns etched through itself.

It is a further object of this invention to provide a better resist material for covering the surface of the glass sheet than has heretofore been used.

It is yet another object to improve the action of the etchant material on the material to be etched by an improvide method of agitation of the etchant.

It will be found that glass sheets are widely available in different thicknesses, but for the purpose of this invention, sheets of glass available under the Corning trademark Microsheet in various thicknesses from 0.003″ to 0.020″ are to be preferred.

In order to protect areas of the sheet which are not to be exposed to the etchant it is necessary to cover the selected areas of the sheet with an etchant resist material. It has been found that normal commercial resist materials suffer from a lack of adherence to the glass surface during deep etching since it appears that the most common etchants tend to destroy the glass resist interface and as a result the resultant etched glass may have extremely poor definition and be completely useless.

It has been found that a layer of "tin oxide" which when suitably applied to the surface of the glass sheet provides a solution to the problem. This involves heating the glass sheet to a temperature between 400° C. and the softening point of the glass sheet in an ordinary atmosphere and then vaporizing or spraying a tin compound ($SnCl_4$ is preferred) on to the hot glass surface.

The resultant film which forms on the glass is loosely called "tin oxide" but is actually a complex layer which is chemically bonded to the glass surface. This layer of "tin oxide" is chemically very resistant and quite resistant to attack by ordinary mineral acids and is only slowly dissolved by hydrofluoric acid.

The "tin oxide" coated glass is next coated with a layer of suitable commercial etch-resist. This may be any one of a number of commercially available etch-resists, but if a complex pattern is to be etched into the glass sheet a major advantage will be experienced by using a photo-etch-resist such as Kodak Metal Etch Resist (KMER) so that the complex pattern may be produced by optical printing techniques. For the purposes of this invention it will be assumed that the etchant resist is applied in the above manner, although it is obvious that other conventional methods of application may be used.

After coating the "tin oxide" covered glass sheet workpiece with a suitable photo-resist material the workpiece is placed in an oven to bake and dry the resist material. When the resist has baked sufficiently it is exposed to the appropriate printing pattern. The workpiece is subsequently developed to remove the photo-resist in the appropriate pattern areas. The workpiece now consists of a glass undersheet the surface of which is completely covered with "tin oxide" over which appears areas of the resist material so that "tin oxide" is exposed in areas where the resist has been developed.

An operation to remove the "tin oxide" in the exposed areas must necessarily follow. This may be accomplished by exposing the exposed "tin oxide" layer to a reacting bath of hydrochloric acid and zinc powder. This may be done by sprinkling zinc powder directly on the workpiece on the side having areas of exposed "tin oxide" and then adding hydrochloric acid in sufficient quantity and strength to give a vigorous reaction with the zinc powder. The same result is obtained by immersing the workpiece directly into a bath of zinc powder and hydrochloric acid while the solution is yet vigorously reacting to produce large quantities of nascent hydrogen. When the "tin oxide" has been removed in the pattern areas the workpiece is washed to remove the hydrochloric acid from the workpiece.

Finally the workpiece is immersed in a hydrofluoric acid bath—an aqueous solution of 50% HF or greater has been found satisfactory—for a sufficient time to etch through the exposed glass pattern after which the workpiece is washed free of the hydrofluoric acid.

The photo-etch-resist is them removed from the remainder of the workpiece by a suitable commercial paint stripper, e.g., Shipley Co. "Stripper 77."

At this stage the workpiece consists of a holed "tin oxide" coated glass sheet which may be used as it is or it may be desirable to remove the "tin oxide" coating completely. If it is necessary to remove the "tin oxide" coating completely this operation is accomplished by immersing the "tin oxide" coated glass sheet in a reacting zinc powder hydrochloric acid suspension similar to the solution to remove the "tin oxide" in the exposed pattern areas. The end result will be a thin sheet of glass having a suitable pattern etched completely through the sheet of glass.

It has been found that the final workpiece makes an excellent mask for use in depositing semiconductor material through the mask on to an insulating substrate.

In practice, the etched glass sheet is placed against one face of a thin substrate. Against the opposite face of the thin substrate is placed a bare sheet of steel or other magnetic material. A number of small magnets suitably placed on the glass sheet provides the necessary clamping action to assure that no relative motion of any of the three sheets i.e., glass, substrate and steel, takes place.

It will also be found that any changes in the pattern etched in the glass sheet may be effected by changing the artwork in the pattern negative—a relatively minor chore—and then any number of masks may be made from the modified negative. It will be noted that once a satisfactory negative is obtained, any number of masks may be made, thus enabling the method to be adapted to mass production techniques.

A modification in the above etching procedure has been found by agitating the etchant with ultra high frequency sound waves at intermittant periods during etching. It has been found that if the etch pattern is broad and shallow that occasional stirring of the etchant is sufficient to assure that fresh etchant is arriving at the surface of the workpiece. When the pattern is narrow and deep, the extreme example being the etching of small blind or through holes, it becomes increasingly difficult to replace the spent etchant with fresh etchant at the bottom of the hole as etching proceeds. The end result is a general slowing down of the etch rate as well as a broadening of the etched hole at points of entry through the resist. No doubt the latter effect is due to easy renewal of the etchant nearer the surface of the hole.

In order to agitate the etchant it has been found most convenient to place the workpiece and the etchant in a tank. The tank is then placed in a tank of water which will function as a water jacket. An immersible transducer is placed in the water and is actuated to produce ultrasonic waves in the water. This energy is transmitted through the water into the etchant tank with the end result being that the agitation of the etchant solution produces cavitation at the surface of the workpiece which tends to clear away spent etchant and replace it with fresh etchant.

It has been found that the ultrasonic generator need not be energized during the whole etch period, indeed to do so will often remove the etch resist from the surface of the glass. A specific example may serve best to illustrate the action.

A series of holes 0.007″ in diameter were etched in sheets of glass 0.010″ to 0.015″ in thickness. The etchant used was 50% hydrofluoric acid and the ultra-sonic generator was actuated for a period of 15 seconds of each minute. It was found that only two to three minutes of etching time was required compared to the conventional etching time of ten to twelve minutes. The portion of time that the ultra-sonic generator is energized may be varied according to the thickness of the material being etched as well as the intricacy of the pattern being etched into the glass.

The above method is ideally used where a large number of very small holes are being etched in glass sheets. It has been used to provide a hole density of 10,000 holes per square inch in glass sheets .004 inch in thickness. It is also to be noted that the hole definition was extremely good.

Variations in the technique are possible and the etched product may serve a variety of purposes. It was found that the application of ultrasonic energy to the etchant tank during deep etching of ⅛″ aluminium plate by 20% hydrochloric acid decreased the etching time by 50% as well as increasing the definition of the etch patterns.

It has been found that the etched glass sheets may be used for a number of purposes one of which has been their use as connectors to supply electrical energy to various devices at a number of locations.

This is made possible due to the fact that "tin oxide" is electrically conductive. The process is carried out on a glass sheet which has had through-holes etched in the sheet. The resist has been removed from the surface of the sheet but the "tin oxide" coating is left intact on one surface of the glass sheet. More "tin oxide" is deposited on the "tin oxide" covered side of the sheet and in the holes in such a manner as to form conductive paths through the holes in the glass sheet.

The resulting glass sheet may be used as a connector for thin film materials by placing the glass sheet and thin film material against one another so that the conductive holes in the glass sheet contact suitable areas of the thin film material.

It is also possible to use a glass sheet having conductive areas passing through itself as the beginning of an electro-luminescent source.

The side of the glass sheet opposite the "tin oxide" covered side is covered with a phosphor which is energized by electricity which flows through the "tin oxide" on the opposite side and through the "tin oxide" in the holes of glass sheet. The holes are made such that the phosphor is in contact with the "tin oxide" of the holes and as a result the phosphor is excited and gives off illumination upon energization.

The "tin oxide" compound is aptly suited to this particular application since it is transparent, electrically conductive and is chemically bonded to the surface of the glass sheet.

Of course, other uses of the etched glass sheets are obvious, but it is understood that the scope of this invention will be limited only by the attached claims.

The embodiments of the invention in which an exclusive property or privilege is claimed is defined as follows:

1. The method of etching a desired pattern in a thin glass sheet which comprises:

(a) heating said glass sheet in air to a temperature between 400° C. and the softening point of said glass sheet and then vaporizing or spraying a tin compound on to the surface of the hot glass sheet to form a protective coating of "tin oxide" which is bonded to said glass sheet;

(b) covering said coated glass sheet with a suitable commercial etch-resist material;

(c) removing the commercial etch-resist material in predetermined areas to form a pattern on the coated glass sheet;

(d) exposing the protective coating formed by the tin compound on the glass sheet to nascent hydrogen in the areas where the commercial resist material has been removed to expose the glass sheet in the desired pattern areas;

(e) etching the glass sheet with a suitable commercial etchant in the presence of ultra-sonic applied agitation to remove the glass in the exposed pattern areas.

2. The method of etching a desired pattern in a thin glass sheet which comprises:

(a) heating said glass sheet in air to a temperature between 400° C. and the softening point of said glass sheet and then vaporizing or spraying tin tetrachloride on to the hot glass surface to form a protective coating of "tin oxide" which is bonded to the surface of said glass sheet;

(b) covering said coated sheet with a suitable commercial etch-resist material;

(c) removing the commercial etch-resist material in predetermined areas to form a pattern on the coated glass sheet;

(d) exposing the protective coating of "tin oxide" formed by the tin tetrachloride on the glass sheet to nascent hydrogen in areas where the commercial resist material has been removed to expose the glass sheet in the desired pattern areas;

(e) etching the glass with a suitable commercial etchant in the presence of ultra-sonic applied agitation to remove the glass in the exposed pattern areas.

3. The method of claim 1 which further includes removing the remainder of the commercial etch-resist material and also the protective coating from the glass sheet subsequent to etching the glass sheet.

4. The method of claim 2 in which the etch-resist material is a commercial photo-etch-resist material and is removed by the appropriate developing techniques subsequent to exposure to a suitable pattern negative, the tin compound covering the glass sheet is removed by exposing the compound to a reacting mixture of zinc and hydrochloric acid and the commercial etchant is an aqueous solution of at least 50% HFl.

5. The method of etching a desired pattern in a thin glass sheet which has been suitably prepared for the operation which comprises:

(a) heating said glass sheet in air to a temperature between 400° C. and the softening point of said glass sheet and then vaporizing or spraying tin tetrachloride on to the hot glass surface;

(b) covering said coating sheet with a suitable commercial photo-resist-etch material;

(c) exposing said sheet and photo-resist-etch material to a desired pattern negative;

(d) developing said photo-resist-etch material so that the resist material is removed in the desired pattern areas;

(e) exposing the protective coating formed by the tin tetrachloride on the glass sheet to nascent hydrogen only in areas where the photo-resist-etch material has been removed to thus expose the glass sheet in the desired pattern areas;

(f) etching the glass in the presence of a suitable application of ultra-sonic energy with a suitable commercial etchant in the desired pattern areas.

6. The method of claim 5 which further includes removing the remainder of the resist material and the protective coating from the glass sheet subsequent to etching the sheet.

7. The method of claim 5 in which the protective coating is removed by exposure to a reacting mixture of zinc and hydrochloric acid, and the suitable commercial etchant is an aqueous solution of at least 50% HFl.

References Cited

UNITED STATES PATENTS

| | | | |
|---|---|---|---|
| 2,904,432 | 9/1959 | Ross et al. | 96—34 |
| 3,186,870 | 6/1965 | Mentzer | 134—3 |
| 3,370,948 | 2/1968 | Rosenbauer | 96—36.2 |

JACOB H. STEINBERG, Primary Examiner

U.S. Cl. X.R.

65—31; 96—36.2; 117—5.5, 211, 212; 156—5, 13, 24